United States Patent [19]

Lin et al.

[11] Patent Number: 5,242,867
[45] Date of Patent: Sep. 7, 1993

[54] COMPOSITION FOR MAKING MULTILAYER CERAMIC SUBSTRATES AND DIELECTRIC MATERIALS WITH LOW FIRING TEMPERATURE

[75] Inventors: Jane-Chyi Lin; Chian-Lii Cherng; Chien-Min Wang, all of Hsinchu, Taiwan

[73] Assignee: Industrial Technology Research Institute, Hsinchu, Taiwan

[21] Appl. No.: 846,541

[22] Filed: Mar. 4, 1992

[51] Int. Cl.$^5$ ............................................. C03C 14/00
[52] U.S. Cl. ......................................... 501/32; 501/66; 501/122
[58] Field of Search ...................... 501/32, 66, 17, 122

[56] References Cited

U.S. PATENT DOCUMENTS

| | | | |
|---|---|---|---|
| 4,547,625 | 10/1985 | Tosaki et al. | 501/61 |
| 4,624,934 | 11/1986 | Kokubu et al. | 501/32 |
| 4,849,379 | 7/1989 | McCormick | 501/66 |
| 4,939,021 | 7/1990 | Aoki et al. | 501/32 |
| 5,024,975 | 6/1991 | Hartmann | 501/32 |
| 5,070,046 | 12/1991 | Hu | 501/65 |
| 5,079,194 | 1/1992 | Jean et al. | 501/32 |

Primary Examiner—Karl Group
Attorney, Agent, or Firm—Ladas & Parry

[57] ABSTRACT

A composition for multilayer ceramic substrates and dielectric materials with low firing temperatures is disclosed. The composition, based on the total weight of the composition, includes 40–80% of amorphous borosilicate glass which contains 60–80% by weight of $SiO_2$, 15–30% by weight of $B_2O_3$, 0.5–1.5% by weight of $Al_2O_3$ and 0.5–3% by weight of alkali oxides; and 20–60% of fillers selected from the groups of alumina, forsterite, quartz, fused $SiO_2$, mullite, cordierite, BN, and AlN.

1 Claim, No Drawings

COMPOSITION FOR MAKING MULTILAYER CERAMIC SUBSTRATES AND DIELECTRIC MATERIALS WITH LOW FIRING TEMPERATURE

BACKGROUND OF THE INVENTION

1. Field of the Invention

This invention relates to compositions for making multilayer ceramic (MLC) substrates and dielectric materials, particularly, to compositions which can be sintered at low temperatures.

2. Description of the Related Art

Generally, electronic packages are used to carry IC chips, to build interconnections, to provide proper heat dissipating medium, and to protect silicon chips from moisture, chemicals or light. Highly reliable electronic packages for military, high performance computer, avionic, and telecommunication applications are usually made of ceramic materials. Because of their high strength, high rigidity, excellent electric insulation, low thermal expansion coefficient, high thermal conductivity and chemical stability, currently multilayer ceramic packages find wide spread applications in consumer electronic products. They can meet most of the material requirements in the development of compact, high performance and multi-functional electronic products. The low thermal expansion coefficients of ceramics enables large size IC chip to be attached to the multilayer board without adverse effect.

Generally, multilayer ceramic packages can be divided into two categories: (1) high temperature type, which is fabricated with high sintering temperature material such as $Al_2O_3$, AlN, or BeO, and (2) low temperature type, which uses glass-ceramic as its major constituent. The latter type is gaining popularity, because its low dielectric constant can reduce signal propagation delay time and its low-firing temperature enables the usage of low melting point, high conductivity conductors (such as Cu, Ag, Au, etc.), thus preventing degradation of the signal strength.

Multilayer ceramic circuit boards are produced by two methods: (1) a multilayer thick film method; and (2) a high temperature co-fired system.

In multilayer thick film method, a sintered ceramic substrate board is first formed and a layer of circuitry is printed on top of it and sintered. Subsequently, a layer of insulative dielectric material is printed onto the circuit layer and then sintered. By repeating these printing and sintering steps, a multilayer ceramic circuit board is obtained. Such a process suffers from the following disadvantages: (1) many printing steps are required; (2) many sintering steps are required; (3) the thickness of the dielectric layers are difficult to control; and (4) the number of printing layers are limited. However, the advantages of such a process are as follows: (1) sintering temperature is low (850° to 900° C.); (2) low resistance conductive metals can be used (such as Ag, Au and Cu); and (3) investment costs are low.

In the high temperature co-fired system, $Al_2O_3$ is the most popular material. It is first mixed with an organic binder and formed into green sheets. Electric circuitry is then formed by screen printing a metal paste on top of the green sheet. The green sheets are then laminated and sintered at an elevated temperature. The disadvantages of this process are: (1) the sintering temperature is high (1500° to 1600° C.); (2) it is necessary to use refractory metals (such as W, Mo) as conductor which have lower conductivity; (3) the dielectric constant of $Al_2O_3$ is 9 to 10 which is relatively high and can result in signal propagation delay; and (4) investment costs are high. The advantages of this process are as follows: (1) the finished product is sintered in one time; (2) the thickness of the dielectric layer is easy to control; (3) the number of laminates is not limited; and (4) the surface roughness is small.

In recent years, a low temperature co-fired system which has all of the advantages of the abovementioned two methods has been developed for manufacturing multilayer ceramic circuit boards. The major constituents in this low temperature co-fired system are glass-ceramic materials. With these materials, the product can be made by a one-step sintering process and the sintering temperature is low (850° to 950° C.). Therefore, high-conductivity metals such as Ag, Ag-Pd, Au, and Cu can be used to construct the interconnections. In addition, such a low firing MLC board has low dielectric constant (4 to 8) and the investment cost is low.

The proposed ceramic materials system includes two categories: (1) crystallized glasses, and (2) glass + ceramics. Crystallized glass usually employs a crystallized glass containing $\alpha$-cordierite or $\beta$-spodumene as a major constituent for the insulating material and is disclosed in U.S. Pat. No. 4,301,324 and Japanese Patent No. Kokai 128856. Glass + ceramics uses an amorphous glass as the matrix and ceramic powders as fillers and is disclosed in many U.S. Patents, such as U.S. Pat. Nos. 4,953,006 and 4,547,625. The system with glass + ceramic is more popular because the physical properties of the substrate can be adjusted by adding various ceramic fillers and its cost is relatively low. Nevertheless, there is still a strong desire to provide an improved composition for this low firing temperature multilayer ceramic substrate and dielectric material with low resistance conductors, low dielectric constant, high sintered density, high mechanical strength and that meets the industrial requirements of thermal expansion coefficient for a of IC elements.

SUMMARY OF THE INVENTION

The objective of this invention is to provide an improved composition for multilayer ceramic substrate and dielectric material with low firing temperature, low dielectric constant, high sintered density, and high mechanical strength.

Accordingly, the composition of this invention for multilayer ceramic substrate and dielectric material with low firing temperature, based on the total weight of said composition, includes:

(I) 40–80% of amorphous borosilicate glass including 60–80% by weight of $SiO_2$, 15–30% by weight of $B_2O_3$, 0.5–1.5% by weight of $Al_2O_3$ and 0.5–3% by weight of alkali oxides, preferably Li, Na and K oxides; and (II) 20–60% of fillers selected from the group of alumina, forsterite, quartz, fused $SiO_2$, mullite, cordierite, BN, AlN and mixtures thereof.

The purpose of the filler addition is to control thermal expansion coefficient and increase mechanical strength and thermal conductivity.

In an aspect of this invention, the abovementioned (I) and (II) components are dispersed in a binder/plasticizer matrix in a volatile nonaqueous solvent. The nonaqueous solvent may be alcohol, methyl ethyl ketone or 1,1,1-trichloroethane. The binder may be polyvinylbutyral (PVB) or acrylic resins. The plasticizer may be dibutyl phthalate (DBP), dioctyl phthalate (DOP) or butyl benzyl phthalate (BBP). A flexible green type is formed by casting a thin layer of the above-described slurry onto a flat carrier film, such as a steel belt or polymeric film, and heating the cast layer to remove the volatile solvent. Each of the green tapes has a thickness of about 4 to 10 mils. The green tape is then cut into proper sized green sheets with via holes for interconnection between layers and with registration holes for alignment. Conductive metal pastes were then via filled and screen printed on the green tapes to give the necessary interconnecting path. Depends on product design, various number of green sheets are aligned and laminated at a temperature of 40°–80° C. under a pressure of 1000–5000 psi for 2 to 20 minutes. The laminated sample is then heated up to 450° C. for 1 hour at a rate of 3° to 5° C./min to burn away the organic matters. The laminated green tapes are then sintered at a temperature of 800° to 950° C. for 15 to 180 minutes to obtain a finished substrate.

In another aspect of this invention, the abovementioned (I) and (II) components are dispersed in a binder/dispersant matrix in a volatile nonaqueous solvent by means of, for example, a three-axis roller. The binder may be ethyl cellulose, nitrocellulose or acrylic resin. The disperant may be fish oil or fatty acid. The volatile nonaqueous solvent may be n-butyl carbitol acetate or $\alpha$-terpineol. The dispersion is mixed into a paste like mixture and printed onto a sintered alumina substrate, which already has a conductive layer or resistor layer for circuitry to form the dielectric layer. After drying in air, the whole stack of layers (alumina substrate, circuitry and dielectric layer) are then fired at a temperature of 800°–950° C. for 15–120 minutes with temperature rising at a rate of 10° to 50° C./min. An insulative dielectric material of this invention is formed by the aforementioned thick film method. By repeating this process every time a conductive layer or circuitry and an dielectric layer are added to the board, a multilayer hybrid circuit board can be obtained. Because the thermal expansion coefficient of the abovementioned dielectric layer can be tailored to completely match that of the alumina substrate, the processing difficulty, defects, and residue stress can be significantly reduced. This shows that the compositions of this invention are good insulative dielectric material for single or multilayer boards.

DETAILED DESCRIPTION OF THE PREFERRED EMBODIMENTS

The present invention will be further clarified by the following examples.

EXAMPLES 1 TO 4

Preparation of the Amorphous Borosilicate Glass

EXAMPLE 1

33.281 g $B_2O_3$, 0.739 g $Al_2O_3$, 0.460 g $Na_2CO_3$, 0.460 g $K_2CO_3$ and 1.128 g $Li_2CO_3$, were pre-reacted at a temperature of 550° C. for about 4 hours to form a mixture. 62.600 g $SiO_2$ was added either before or after the pre-reaction process. The mixture was then melted in covered Pt/Rh alloyed crucibles at 1400°–1550° C. for 30 minutes. The melted glass was removed from the furnace and poured onto a water-cooling stainless steel roller. Thin glass ribbons were crushed to reduce the ribbon size, then loaded into an alumina/silica ball mill jar half filled with ¼" alumina balls to mill the ribbon pieces into powder of several $\mu$m particle size. A small amount of isopropanol was added to prevent the caking during milling. Using thin glass ribbons could reduce the total amount of milling time and minimize the degree of contamination.

EXAMPLE 2

This example is similar to example 1 except that the amount of $B_2O_3$, $Al_2O_3$, $Na_2CO_3$, $K_2CO_3$, $Li_2CO_3$ and $SiO_2$ are 25.198 g, 1.110 g, 0.686 g, 1.603 g, 1.756 g and 69.655 g, respectively.

EXAMPLE 3

This example is similar to example 1 except that the amount of $B_2O_3$, $Al_2O_3$, $Na_2CO_3$, $K_2CO_3$, $Li_2CO_3$ and $SiO_2$ are 33.34 g, 0.741 g, 0.641 g, 1.609 g, 1.130 g and 62.53 g, respectively, and silica crucible are used in the melting process rather than using Platinum/Rhodium crucible.

EXAMPLE 4

This example is similar to example 3 except that the amount of $B_2O_3$, $Al_2O_3$, $Na_2CO_3$, $K_2CO_3$, $Li_2CO_3$ and $SiO_2$ are 25.24 g, 1.112 g, 0.685 g, 1.605 g, 1.757 g and 69.600 g, respectively.

Wet chemical analyses were done on the amorphous borosilicate glass obtained in examples 1 to 4 and the results are shown in Table 1. It can be found that the analyzed compositions are almost the same as the desired compositions. This proves that the composition of glass can be controlled successfully by the applicants.

TABLE 1

| Ex. | 1 | | 2 | | 3 | | 4 | |
|---|---|---|---|---|---|---|---|---|
| Comp. | Theo. (wt %) | Anal. (wt %) | Theo. (wt %) | Anal. (wt %) | Theo. (wt %) | Anal. (wt %) | Theo. (wt %) | Anal. (wt %) |
| $SiO_2$ | 68.60 | 67.64 | 76.64 | 75.94 | 68.60 | 67.49 | 76.64 | 75.66 |
| $B_2O_3$ | 28.48 | 29.5 | 19.72 | 20.6 | 28.48 | 29.6 | 19.72 | 20.9 |
| $Al_2O_3$ | 0.81 | 0.81 | 1.22 | 1.17 | 0.81 | 0.81 | 1.22 | 1.13 |
| $Na_2O$ | 0.41 | 0.40 | 0.44 | 0.41 | 0.41 | 0.41 | 0.44 | 0.42 |
| $K_2O$ | 1.20 | 1.19 | 1.20 | 1.13 | 1.20 | 1.19 | 1.20 | 1.14 |
| $Li_2O$ | 0.50 | 0.46 | 0.78 | 0.75 | 0.50 | 0.50 | 0.78 | 0.75 |

EXAMPLES 5 TO 9

Preparation of the Multilayer Ceramic Substrate With Low Firing Temperature

Dielectric compositions were formulated by admixing 50 g of finely divided amorphous borosilicate glass particles, 25 g fused $SiO_2$ and 25 g $Al_2O_3$ (composition ratio is 50/25/25). The composition of glass used was from example 2 with 75.94 wt % $SiO_2$, 20.6 wt % $B_2O_3$, 1.17 wt % $Al_2O_3$, 0.41 wt % $Na_2CO_3$, 1.13 wt % $K_2CO_3$ and 0.75 wt % $Li_2CO_3$. Casting slurries were formulated by dispersing the dielectric compositions in an organic solution containing acrylic resins, dioctyl phthalate and 1,1,1-trichloroethane. The dispersions were formed by ball-milling for 20 hours. The slurry was cast onto a silicon-coated polyester film to produce a flexible green tape. The thickness of the cast green tapes varied between 4-10 mils. These tapes were cut into 3"×3" pieces with designed via pattern. Ag-Pd pastes were then via filled and screen printed on the green tapes to give the necessary circuitry. Eight sheets of green tapes were aligned and laminated together by means of a confined pressing die operated at 70° C. for 20 minutes under 3000 psi. 3"×3" laminated parts were preheated at a rate of 3° C./min in air and held at 450° C. for one hour to remove the organic binders. After binder burn out, the parts were fired at 900° C. for 60 minutes. Thus, a fired tape or substrate was obtained and the properties thereof was tested and the results are shown in Table 3. The properties of the green tapes are shown in Table 2.

TABLE 2

(Green Tape Properties)

| Test items | test results |
| --- | --- |
| 1. Thickness | 4.8-6.8 mils |
| 2. Width | 5.0-8.0 in |
| 3. Volume Fraction | |
| Ceramics | 0.53 |
| Organics | 0.17 |
| Voids | 0.30 |
| 4. Tensile Strength | 150 psi |
| 5. Peak elongation | 10% |
| 6. Young's modulus | 12500 psi |
| 7. 1% Secant Modulus | 15000 psi |

TABLE 3

(Material Properties of Fired Substrate)

| Test items | test results |
| --- | --- |
| 1. Dielectric Constant (k at 1MHz) | 4.7 ± 0.1 |
| 2. Dielectric loss (at 1MHz) | 0.1% |
| 3. Insulation Resistance (at 100 VDC) | >$10^{14}$ Ohms |
| 4. Breakdown voltage | >500 volts/mil |
| 5. Thermal Expansion Coefficient (25° C. to 400° C.) | 4.6 ppm/°C. |
| 6. Thermal Conductivity | 2.86 w/m °K. |
| 7. Surface Roughness | 4-6 μ-in CAL |
| 8. Flexural Strength | 180 MPa |
| 9. Relative Density (%) | 96.7 |

EXAMPLE 6

Preparation of the Dielectric Material

The mixed powder of 50 g amorphous borosilicate glass used in example 5, 25 g alumina and 25 g forsterite were dispersed in an organic solution containing ethyl cellulose, fatty acid and α-terpineol. The dispersion was then processed with three-roll mill to obtain an uniform screenable dielectric paste. The paste was then printed onto a ceramic substrate with circuitry attached on it. The thickness of the printed film was 1 mil. The film was then heated at a rate of 30° C./min and held at 850° C. for 15 minutes. Finally, a dielectric material was obtained and the test results are shown in Table 4.

TABLE 4

(Dielectric Material Properties)

| Test items | test results |
| --- | --- |
| 1. Dielectric Constant (k at 1MHz) | 5.6 ± 0.1 |
| 2. Dielectric loss (at 1MHz) | 0.2% |
| 3. Insulation Resistance (at 100 VDC) | >$10^{12}$ Ohms |
| 4. Breakdown voltage | >500 volts/mil |
| 5. Thermal Expansion Coefficient (25° C. to 400° C.) | 6.7 ppm/°C. |
| 6. Thermal Conductivity | 2.97 w/m °K. |
| 7. Surface Roughness | 4-6 μ-in CAL |
| 8. Flexural Strength | 203 MPa |
| 9. Relative Density (%) | 96.7 |

EXAMPLES 7 TO 15

As abovementioned, the objective of adding fillers is to control the thermal expansion coefficient, to reduce the dielectric constant, increase mechanical strength and thermal conductivity. To demonstrate this, different fillers were added to the borosilicate glass from example 2 to produce multilayer ceramic substrates with low firing temperature of the present invention. The compositions of examples 7 to 15 are shown in Table 5.

TABLE 5

| Comp. | Ex. 7 | 8 | 9 | 10 | 11 | 12 | 13 | 14 | 15 |
| --- | --- | --- | --- | --- | --- | --- | --- | --- | --- |
| Boro. Glass | 50% | 45% | 50% | 50% | 50% | 70% | 50% | 70% | 70% |
| Forsterite | | 25% | 25% | | | | | | |
| Alumina | 50% | 30% | 25% | | 25% | | | | |
| Quartz | | | | 30% | | | | | |
| Fused SiO$_2$ | | | | 20% | 25% | | | | |
| Mullite | | | | | | 30% | | | |
| Cordierite | | | | | | | 50% | | |
| AlN | | | | | | | | 30% | |
| BN | | | | | | | | | 30% |

The properties of the densified multilayer ceramic substrates from examples 7 to 15 are tested and the results are shown in Table 6.

TABLE 6

| Test Items | Ex. Test Results | | | | | | | | |
| --- | --- | --- | --- | --- | --- | --- | --- | --- | --- |
| | 7 | 8 | 9 | 10 | 11 | 12 | 13 | 14 | 15 |
| Die. Con. (1MHZ) | 5.6 | 5.7 | 5.6 | 4.2 | 4.7 | 4.6 | 4.7 | 5.1 | 4.3 |
| Die. loss (%) (1MHZ) | 0.2 | 0.2 | 0.2 | 0.2 | 0.1 | 0.2 | 0.6 | 0.4 | 0.1 |
| TEC (ppm/°C.) | 4.99 | 6.88 | 6.58 | 7.40 | 4.60 | 5.71 | 2.95 | 3.48 | 4.85 |
| Flexural Strength (MPa) | 220 | 210 | 203 | 175 | 180 | 186 | 192 | 184 | 193 |

It can be seen from Table 6 that the dielectric constant (abbreviation: Die. Con.) of the multilayer ceramic substrates with low firing temperatures of the present invention are all smaller than 5.7 which is far smaller than the dielectric constants of the conventional alumina substrates. In addition, the dielectric loss (abbreviation: Die. Loss) of each of the ceramic substrates is very small. It is worthy of note that in accordance with the present invention, the thermal expansion coefficient (abbreviation: TEC) of the ceramic substrates were successfully controlled between 3-8 ppm/°C. which matches the TEC of IC chip (TEC: 3.5 ppm/°C.) or alumina substrates (TEC: 7.0 ppm/°C.). The thermal expansion coefficient of a material is very important factor in deciding suitability of the material for multi-layer electronic packaging system. If the thermal expansion coefficient is not matched with that of the silicon chips, the solder joint or IC chips will crack during operation and the failure of the electronic product is sure to result.

EXAMPLES 16-17

In examples 16 and 17, amorphous borosilicate glasses from examples 1 and 2, respectively, were used to produce the multilayer ceramic substrates with low firing temperature of this invention by the steps as described in example 6. The resulted products were tested and the results are shown in Table 7.

TABLE 7

| Test Items | Ex. Test Results | |
|---|---|---|
| | 16 | 17 |
| Dielectric Constant (1MHz) | 5.6 | 5.5 |
| Dielectric Loss (1MHz) (%) | 0.2 | 0.2 |
| TEC (ppm/°C.) | 6.67 | 6.77 |
| Relative Density (%) | 96.7 | 96.7 |

It can be seen from Table 7 that the ceramic substrates respectively made from $B_2O_3$-rich (28.48%, example 1) and $B_2O_3$-deficient (19.72%, Example 2) have similar sintering and dielectric properties, and thermal expansion coefficient. This proves the amorphous borosilicate glass of this invention has good stability and is insensitive to slight material composition variations. Therefore, it is suitable for industrial mass-production.

The substrate or dielectric material produced in accordance with the present invention has the following advantages:

(1) The firing temperature is low (800°-950° C.), whereas the sintering temperature of the conventional alumina material is high (1500°-1600° C.).

(2) The relative density of the substrates or materials can reach to 97%. This can guarantee the final products have desired hermeticity, and electric-insulating properties, and mechanical strength.

(3) The dielectric constant of this invention (4-6) is much smaller than the dielectric constant of the conventional alumina material (9-10). Therefore, a reduction in the signal propagation delay time is attained.

(4) Different fillers can be used to control the thermal expansion coefficient, mechanical properties, and thermal conductivity, etc.

(5) The thermal expansion coefficient of the substrates or dielectric layer materials of this invention is 3-8 ppm/°C. Therefore, they can be used as packaging substrates for many kinds of electronic elements and as dielectric materials of the thick films process on alumina substrates. The application range of this invention is relatively broad.

(6) The amorphous borosilicate glass of this invention has good stability and little manufacturing variable factors.

(7) The firing temperature use in this invention is lower, so that low melting point, high conductivity metals such as Ag, Au, Cu and Ag-Pd can be used to form circuitry to reduce signal degradation during propagation.

With this invention thus explained, it is apparent that numerous modifications and variations can be made without departing from the scope and spirit of this invention. This invention is limited only as indicated in the appended claims but not by the above examples.

We claim:

1. A composition for multi-layer ceramic substrates and dielectric materials with low firing temperature consisting essentially of (1) 45 to 70% by weight of an amorphous borosilicate glass comprising 60-80% by weight $SiO_2$, 15-30% by weight of $B_2O_3$, 0.5-0 1.5% by weight of $Al_2O_3$ and 0.5-3% by weight of alkali oxides and (2) 30 to 55% by weight of a filler wherein said filler is a mixture of fosterite and alumina by which the coefficient of thermal expansion can be adjusted to match alumina.

* * * * *